(12) United States Patent
Chuang et al.

(10) Patent No.: US 12,433,083 B2
(45) Date of Patent: Sep. 30, 2025

(54) DISPLAY DEVICE WITH MULTI-LAYERED STRUCTURE FOR PRESENTING LUMINOUS IMAGES OF DIFFERENT COLORS

(71) Applicant: LITE-ON TECHNOLOGY CORPORATION, Taipei (TW)

(72) Inventors: Shih-Yi Chuang, Tainan (TW); Yu-Kuan Lin, New Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 565 days.

(21) Appl. No.: 17/991,803

(22) Filed: Nov. 21, 2022

(65) Prior Publication Data

US 2023/0170378 A1 Jun. 1, 2023

Related U.S. Application Data

(60) Provisional application No. 63/284,010, filed on Nov. 30, 2021.

(30) Foreign Application Priority Data

Aug. 10, 2022 (CN) .......................... 202222103012.X

(51) Int. Cl.
*H10H 29/14* (2025.01)
*H10H 20/855* (2025.01)

(52) U.S. Cl.
CPC ........ *H10H 29/142* (2025.01); *H10H 20/855* (2025.01)

(58) Field of Classification Search
CPC .......................... H10H 29/142; H10H 20/855
USPC .......................................................... 257/89
See application file for complete search history.

(56) References Cited

U.S. PATENT DOCUMENTS

2019/0018183 A1* 1/2019 Ochi .................... G02B 6/0043

FOREIGN PATENT DOCUMENTS

WO WO-2010131735 A1 * 11/2010 ............. G09F 13/18

* cited by examiner

*Primary Examiner* — Norman D Richards
*Assistant Examiner* — Colin Russell McCutcheon
(74) *Attorney, Agent, or Firm* — Li & Cai Intellectual Property Office

(57) ABSTRACT

A display device is provided. The display device includes a substrate, a first optical unit, a first light-emitting unit, a second optical unit, a second light-emitting unit, and a light-blocking unit. The first optical unit is disposed on the substrate and includes a first coating layer and a first light guide layer. A light-emitting region of the first light-emitting unit corresponds in position to a first light incident surface of the first light guide layer. The second optical unit is disposed on the first optical unit and includes a second coating layer and a second light guide layer. A light-emitting region of the second light-emitting unit corresponds in position to a second light incident surface of the second light guide layer. The light-blocking unit separates the first light incident surface and the second light incident surface.

14 Claims, 14 Drawing Sheets

DISPLAY DEVICE WITH MULTI-LAYERED STRUCTURE FOR PRESENTING LUMINOUS IMAGES OF DIFFERENT COLORS

CROSS-REFERENCE TO RELATED PATENT APPLICATION

This application claims the benefit of priorities to the U.S. Provisional Patent Application Ser. No. 63/284,010 filed on Nov. 30, 2021, and China Patent Application No. 202222103012.X, filed on Aug. 10, 2022 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a display device, and more particularly to a display device that can clearly present luminous images of different colors.

BACKGROUND OF THE DISCLOSURE

A conventional display device adopts a light-emitting configuration that has a multi-layer structure, so as to present various luminous images of different colors (e.g., a logo). In order to display luminous images of more than three different colors, the conventional display device needs to be designed to have more than three layers.

However, when the conventional display device emits light, the luminous image corresponding to the third layer or above is prone to blurring (i.e., a shaded region appearing unexpectedly in the luminous image), or the brightness of the luminous image is reduced. In order to avoid the aforementioned situation, the multi-layer structure of the conventional display device is mostly designed to have no more than two layers. However, this limits quantities, types, and colors of the luminous images that the conventional display device can ultimately display. That is to say, the conventional display device is limited within the above-mentioned structure, such that any further improvements are difficult to accomplish.

SUMMARY OF THE DISCLOSURE

In response to the above-referenced technical inadequacies, the present disclosure provides a display device that can effectively improve problems associated with a conventional display device.

In one aspect, the present disclosure provides a display device. The display device includes a substrate, a first optical unit, a first light-emitting unit, a second optical unit, a second light-emitting unit, and a light-blocking unit. The first optical unit is disposed on the substrate and includes a first coating layer and a first light guide layer. The first light guide layer has at least one reflective pattern, and the first coating layer has a light permeable colored region that covers the at least one reflective pattern. The first light-emitting unit is disposed on one side of the first optical unit. The first light-emitting unit has a first light-emitting region, and the first light-emitting region corresponds in position to a first light incident surface of the first light guide layer. The second optical unit is disposed on the first optical unit and includes a second coating layer and a second light guide layer. The second light guide layer has a reflective pattern, and the second coating layer has a patterned light-transmitting region that covers the reflective pattern of the second light guide layer and the at least one reflective pattern of the first light guide layer. The second light-emitting unit is disposed on one side of the second optical unit and includes a second light-emitting region. The second light-emitting region corresponds in position to a second light incident surface of the second light guide layer. The light-blocking unit separates the first light incident surface and the second light incident surface.

Therefore, in the display device provided by the present disclosure, by virtue of "the at least one reflective pattern being covered by the light permeable colored region, and the reflective pattern of the second light guide layer and the at least one reflective pattern of the first light guide layer being covered by the patterned light-transmitting region," "the light-blocking unit separating the first light incident surface and the second light incident surface," and "the first light-emitting region corresponding in position to the first light incident surface of the first light guide layer, and the second light-emitting region corresponding in position to the second light incident surface of the second light guide layer," the first light-emitting unit and the second light-emitting unit can each provide light to the corresponding reflective patterns without interfering with each other, so as to further provide different luminous images in the same region.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
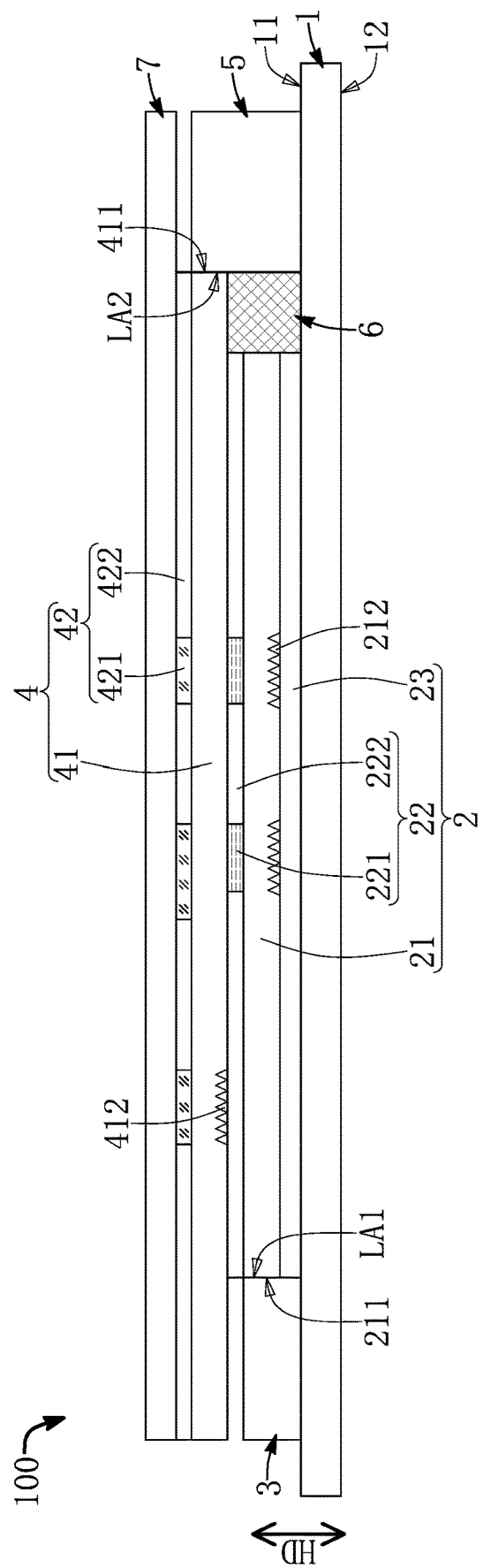
FIG. 1 is a schematic cross-sectional view of a display device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure provides a display device 100. As shown in FIG. 1, the display device 100 includes a substrate 1, a first optical unit 2 disposed on the substrate 1, a first light-emitting unit 3 disposed on one side of the first optical unit 2, a second optical unit 4 disposed on the first optical unit 2, a second light-emitting unit 5 disposed on one side of the second optical unit 4, and a light-blocking unit 6 that is disposed between the first light-emitting unit 3 and the second light-emitting unit 5.

Referring to FIG. 1, the substrate 1 has two side surfaces 11 and 12 that are opposite to each other, and the substrate 1 has a height direction HD that is perpendicular to any one of the side surfaces 11 and 12. The first optical unit 2 and the second optical unit 4 are stacked onto the substrate 1 along the height direction HD. The substrate 1 further has a conductive pattern (not shown in the figure), and the conductive pattern is electrically connected to the first light-emitting unit 3, the second light-emitting unit 5, any other electronic components located on the substrate 1, and/or an external power supply, so as to drive the light-emitting units and electronic components.

Figure 2:
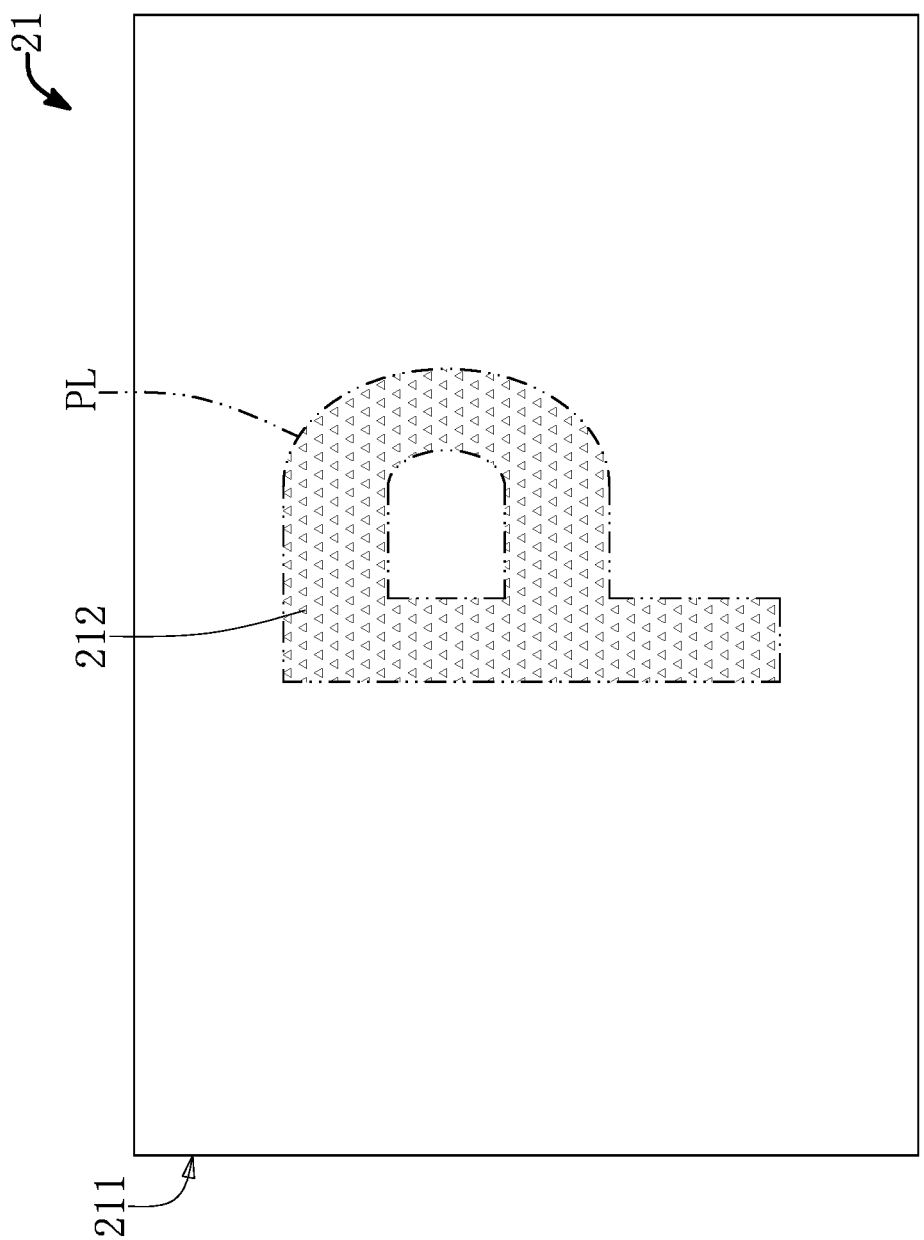
FIG. 2 is a schematic cross-sectional view taken along a first light guide layer of the display device according to the first embodiment of the present disclosure.

Referring to FIGS. 1 and 2, the first optical unit 2 includes a first light guide layer 21 and a first coating layer 22. Specifically, the first light guide layer 21 is disposed on the side surface 11 and has at least one reflective pattern under the first light guide layer 21, and the at least one reflective pattern can reflect light in a specific direction (e.g., upward). In the present embodiment, a first microstructure 212 is directly stamped onto the surface of the first light guide layer 21 to form the at least one reflective pattern, but the present disclosure is not limited thereto. For example, in another embodiment of the present disclosure (not shown), a film can be additionally disposed on the first light guide layer 21 of the first optical unit 2, and the film realizes the function of the aforementioned reflective pattern on the first light guide layer 21 in any manner commonly used in the related art. In addition, for convenience of description, a quantity of the reflective pattern of the first light guide layer 21 in the present embodiment is one, and the reflective pattern is further referred to as a lower reflective pattern PL.

In one practical application, the first light guide layer 21 may include a first light incident surface 211 through which the light enters, and multiple ones of the first microstructure 212 (as shown in FIG. 2). The first microstructures 212 are arranged into a specific pattern (e.g., P-shaped) according to design requirements, so as to form the lower reflective pattern PL. When the light is transmitted in the first light guide layer 21, the first microstructures 212 can uniformly reflect the light in the specific direction to form a luminous image. Preferably, the specific direction is away from the substrate 1 along the height direction HD.

Figure 3:
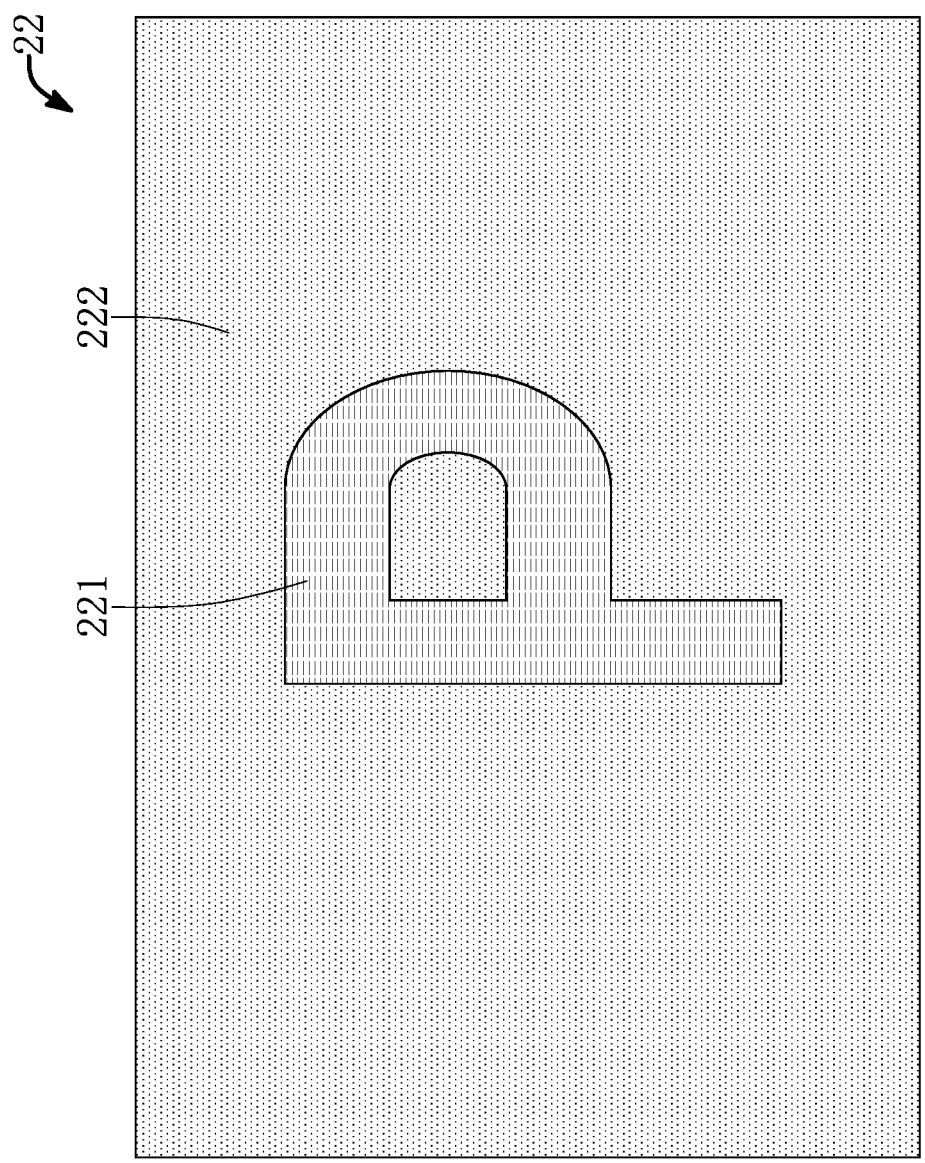
FIG. 3 is a schematic cross-sectional view taken along a first coating layer of the display device according to the first embodiment of the present disclosure.

As shown in FIG. 1 to FIG. 3, in the present embodiment, the first light guide layer 21 is covered by the first coating layer 22 that has a light permeable colored region 221. Specifically, the light permeable colored region 221 covers the lower reflective pattern PL of the first light guide layer 21, so that the light reflected by the lower reflective pattern PL can penetrate the light permeable colored region 221 to filter a spectrum of the light.

Further, the light permeable colored region 221 is located on a reflection path of the lower reflective pattern PL (as shown in FIG. 1 to FIG. 3), and the light permeable colored region 221 corresponds in position to the lower reflective pattern PL. Accordingly, when a wavelength of the light emitted by the first light-emitting unit 3 is within a transmission spectrum of a colorant in the light permeable colored region 221, the light can form a luminous image with color by passing through the light permeable colored region 221. For example, red light or light (e.g., white light) having a red spectrum can penetrate the light permeable colored region 221 that is red to generate a red P-shaped luminous image. Conversely, when the wavelength of the light emitted by the first light-emitting unit 3 is not within the transmission spectrum of the colorant in the light permeable colored region 221, the light cannot pass through the light permeable colored region 221 to present the luminous image.

In addition, in order to ensure that the luminous image has a clear outline, the first coating layer 22 in the present embodiment further includes a first light-shielding region 222, and the first light-shielding region 222 does not overlap with or surround the light permeable colored region 221.

Figure 6:
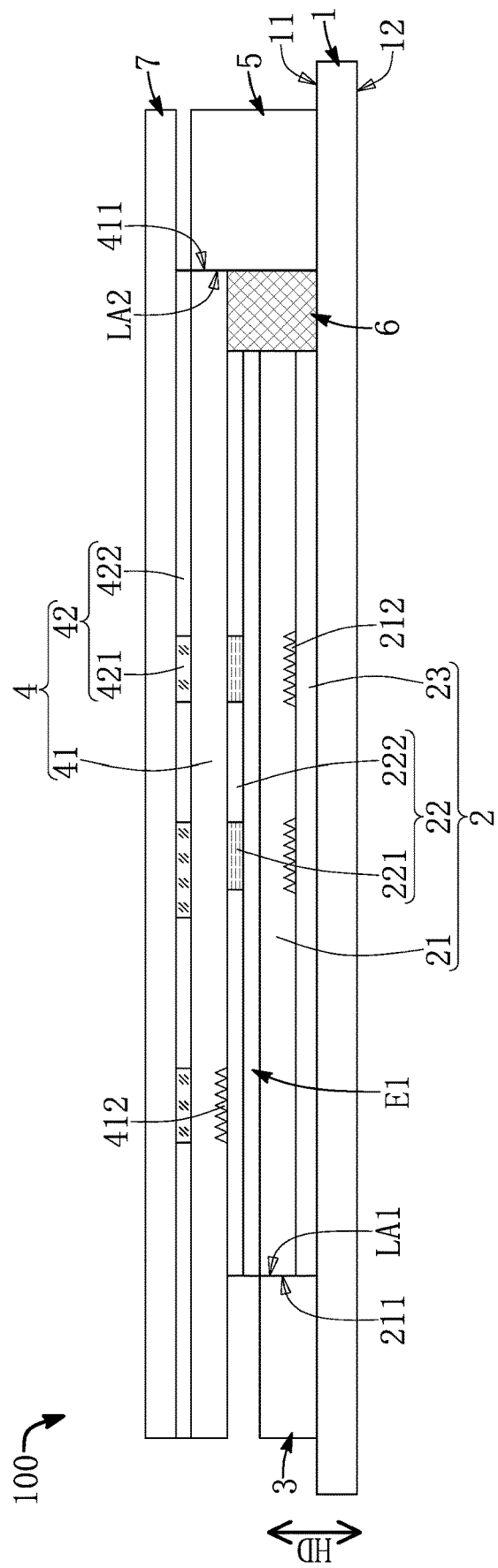
FIG. 6 is a schematic cross-sectional view showing another configuration of the display device according to the first embodiment of the present disclosure.

Referring to FIG. 1 to FIG. 3, in one practical application, the light permeable colored region 221 and the first light-shielding region 222 can be directly disposed (e.g., printed) on the first light guide layer 21. As shown in FIG. 6, in another configuration, the first coating layer 22 can also be coated onto a carrier E1, and the carrier E1 has light transmittance and covers the first light guide layer 21.

Referring to FIG. 1 to FIG. 3, the first light-emitting unit 3 is disposed on the substrate 1, and the first light-emitting unit 3 is located on one side of the first light guide layer 21, so that the light is emitted by the first light-emitting unit 3 toward the first light guide layer 21 and is reflected to the light permeable colored region 221.

Specifically, the first light-emitting unit 3 can be a lateral light-emitting diode and has a first light-emitting region LA1. The first light-emitting region LA1 corresponds in position to the first light incident surface 211 of the first light guide layer 21. Accordingly, the first light-emitting unit 3 can emit the light through the first light-emitting region LA1, so that the light enters the first light guide layer 21 and is reflected by the lower reflective pattern PL to penetrate the light permeable colored region 221. However, the present disclosure is not limited thereto.

For example, in another embodiment of the present disclosure (not shown), the first light-emitting unit 3 may be not in contact with the substrate 1, and may be directly fixed to the one side of the first light guide layer 21 in any manner (e.g., sticking).

Figure 4:
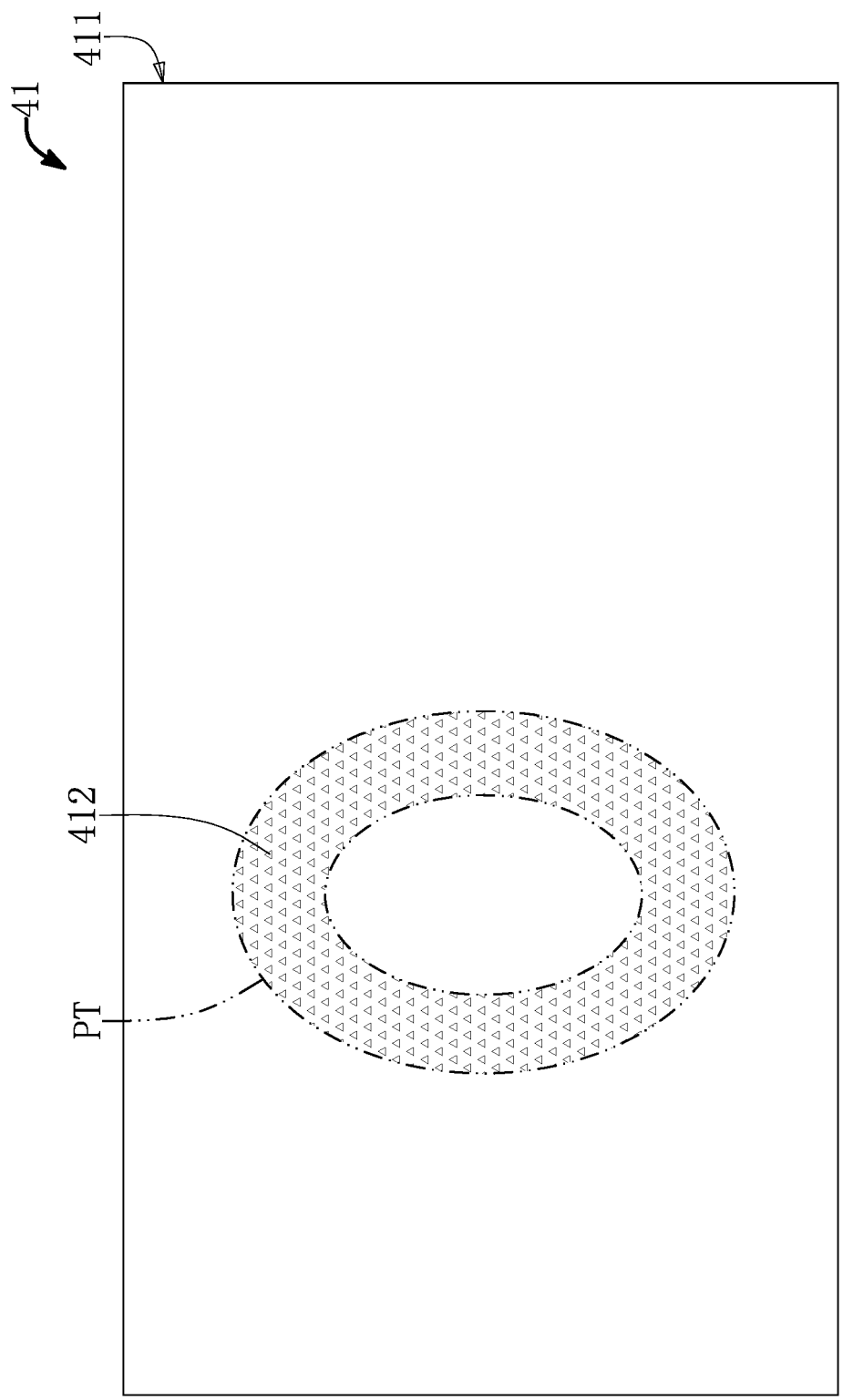
FIG. 4 is a schematic cross-sectional view taken along a second coating layer of the display device according to the first embodiment of the present disclosure.
Figure 5:
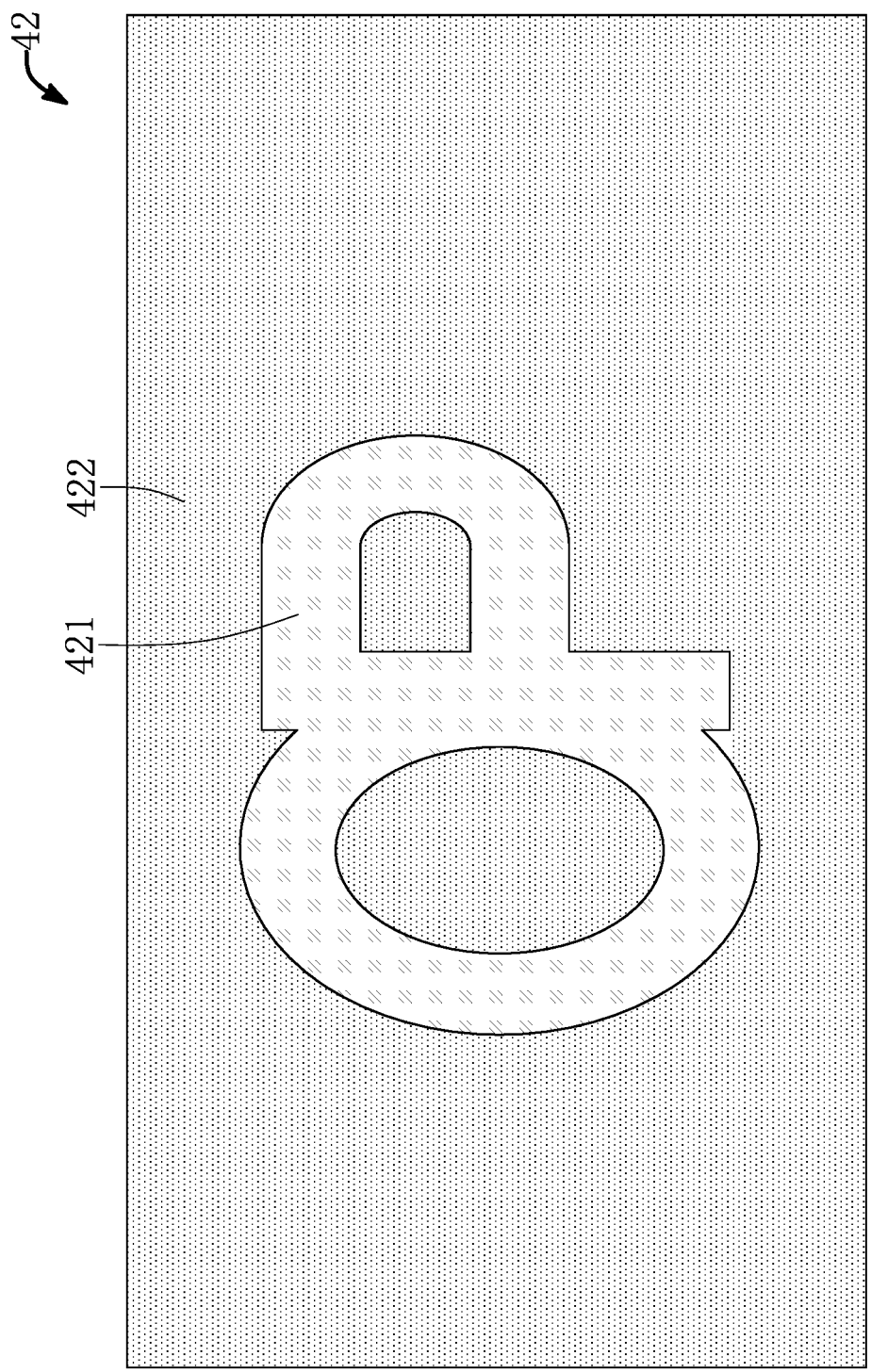
FIG. 5 is a schematic cross-sectional view taken along a second coating layer of the display device according to the first embodiment of the present disclosure.

Referring to FIG. 1, FIG. 4, and FIG. 5, the second optical unit 4 includes a second light guide layer 41 and a second coating layer 42, and the second coating layer 42 has a patterned light-transmitting region 421. Specifically, the second light guide layer 41 is located on the first light guide layer 21 and the first coating layer 22, and the second light guide layer 41 has a reflective pattern that can reflect the light in the specific direction.

In some implementations, one side of the second light guide layer 41 can be flush with one side of the first light-emitting unit 3, and another side of the second light guide layer 41 (i.e., a side that is away from the first light-emitting unit 3) can be flush with the light-blocking unit 6. In addition, for convenience of description, the reflective pattern of the second light guide layer 41 in the present embodiment is further referred to as an upper reflective pattern PT.

In one practical application, as shown in FIG. 1 and FIG. 4, the second light guide layer 41 may include a second light incident surface 411 through which the light enters and a plurality of second microstructures 412. The second microstructures 412 are arranged into a specific pattern (e.g., O-shaped) according to design requirements, so as to form the upper reflective pattern PT. When the light is transmitted in the second light guide layer 41, the second microstructures 412 can uniformly reflect the light in the specific direction to form a luminous image. Similarly, it is preferable for the specific direction to be away from the substrate 1 along the height direction HD.

Referring to FIG. 2, FIG. 4, and FIG. 5, the patterned light-transmitting region 421 is located above the lower reflective pattern PL and the upper reflective pattern PT, and the light reflected by the lower reflective pattern PL and the upper reflective pattern PT can penetrate the patterned light-transmitting region 421 (as shown in FIG. 1).

In other words, the patterned light-transmitting region 421 is located on the reflection path of the lower reflective pattern PL and a reflection path of the upper reflective pattern PT, and the patterned light-transmitting region 421 has a light-emitting region that corresponds in shape to the lower reflective pattern PL and the upper reflective pattern PT.

In the present embodiment, due to the trend of miniaturization, the display device needs to display different light-emitting patterns in the same space. Therefore, the lower reflective pattern PL of the first light guide layer 21 and the upper reflective pattern PT of the second light guide layer 41 partially overlap in a vertical direction. At this time, an overlapping region of the lower reflective pattern PL and the upper reflective pattern PT is a region that corresponds to the patterned light-transmitting region 421. In addition, since an overlapping portion of the upper reflective pattern PT needs to allow the light reflected by the lower reflective pattern PL to pass through, at least the second microstructure 412 of said portion must also have light transmittance.

Moreover, in order to ensure that light-emitting regions of the lower reflective pattern PL and the upper reflective pattern PT have a clear outline, the second coating layer 42 in the present embodiment further includes a second light-shielding region 422 located on the second light guide layer 41, and the second light-shielding region 422 does not overlap with or surround the patterned light-transmitting region 421.

In one practical application, the patterned light-transmitting region 421 and the second light-shielding region 422 can be directly disposed (e.g., printed) on the second light guide layer 41. In addition, in some implementations, the patterned light-transmitting region 421 may be a region without coating material (i.e., an empty region), and the light reflected by the reflective patterns can directly penetrate the patterned light-transmitting region 421. In other embodiments, the patterned light-transmitting region 421 may be coated with a light-transmitting coating material (which is preferably a transparent resin).

Referring to FIG. 1 and FIG. 4, the second light-emitting unit 5 is disposed on the substrate 1 and is located on the another side of the second light guide layer 41. The second light-emitting unit 5 can emit the light toward the second microstructures 412 of the second light guide layer 41, so that the light is reflected and penetrates the patterned light-transmitting region 421.

Specifically, the second light-emitting unit 5 can be a lateral light-emitting diode, and has a second light-emitting region LA2 that corresponds in position to the second light incident surface 411 of the second light guide layer 41. In other words, a height of the second light-emitting unit 5 relative to the substrate 1 is greater than a height of the first light-emitting unit 3 relative to the substrate 1. Accordingly, the second light-emitting unit 5 can emit the light through the second light-emitting region LA2, so that the light enters the second light guide layer 41 and is reflected by the upper reflective pattern PT.

In practice, the second light-emitting unit 5 may use blue light, so that the luminous image generated by the second light-emitting unit 5 through the second optical unit 4 is blue in color. In addition, when the light permeable colored region 221 is red, the first light-emitting unit 3 may use red or white light, so that the luminous image generated by the first light-emitting unit 3 through the first optical unit 2 is red in color. That is to say, in the present embodiment, the display device can display a blue O-shaped luminous image and a red P-shaped luminous image at different times.

Referring to FIG. 1 and FIG. 3, the light-blocking unit 6 is disposed between the first light-emitting unit 3 and the second light-emitting unit 5 to separate the first light incident surface 211 and the second light incident surface 411. Specifically, the light-blocking unit 6 in the present embodiment is made of an opaque material, and the light-blocking unit 6 shields another side of the first optical unit 2 that faces the second light-emitting unit 5. One side of the light-blocking unit 6 that is away from the first optical unit 2 is flush with the another side of the second light guide layer 41 (which faces the second light-emitting unit 5), and a height of the light-blocking unit 6 relative to the substrate 1 is preferably the same as a height of the first optical unit 2 relative to the substrate 1, so that the light-blocking unit 6 and the first optical unit 2 can jointly support the second light guide layer 41 (as shown in FIG. 1).

That is to say, the second optical unit 4 covers the light-blocking unit 6 and the first optical unit 2, and a height of the second light-emitting region LA2 exceeds the height of the light-blocking unit 6 relative to the substrate 1, so that a height of the first light-emitting region LA1 does not exceed the height of the light-blocking unit 6 relative to the substrate 1. In other words, height positions of the first light-emitting region LA1 and the second light-emitting region LA2 in the present embodiment are not equal (or not parallel) to each other.

Accordingly, the light-blocking unit 6 prevents the light of the first light-emitting unit 3 that directly or indirectly penetrates the first optical unit 2 from affecting the second light-emitting unit 5, and also prevents the light of the second light-emitting unit 5 from directly or indirectly affecting the first optical unit 2 and/or the first light-emitting unit 3. In this way, the first light-emitting unit 3 and the second light-emitting unit 5 can provide an ideal light source for generating the corresponding luminous image.

As shown in FIG. 6, it is worth mentioning that the first optical unit 2 can further include a reflective layer 23. The reflective layer 23 is located on one side of the first light guide layer 21 away from the light permeable colored region 221 (that is, the reflective layer 23 is located between the first light guide layer 21 and the substrate 1), and the reflective layer 23 preferably has a dark color (e.g., black in color). Accordingly, the reflective layer 23 can absorb weak light transmitted downward by the second optical unit 4 (so as to prevent a shaded region from unexpectedly appearing in the luminous image), and is also able to reflect the light transmitted downward by the first optical unit 2. Naturally, the reflective layer 23 can be omitted according to practical requirements.

Furthermore, the display device 100 in the present embodiment further includes a filter cover 7 disposed on the second optical unit 4, and a light-transmitting projection path defined by orthogonally projecting the filter cover 7 toward the substrate 1 passes through the light permeable colored region 221 and the patterned light-transmitting region 421. Accordingly, the filter cover 7 can filter an external light source (i.e., light sources other than the first light-emitting unit 3 and the second light-emitting unit 5) to ensure the clarity of the luminous image. The filter cover 7 can be made of a dark (e.g., dark gray) light-shielding material. Naturally, the filter cover 7 can be omitted according to practical requirements.

Second Embodiment

Referring to FIG. 7 to FIG. 10, a second embodiment of the present disclosure provides a display device 100'. The present embodiment is similar to the first embodiment, and the similarities therebetween will not be repeated herein. The differences between the present embodiment and the first embodiment are mainly as follows.

The display device 100' of the present embodiment includes a first light guide layer 21', a light permeable colored region 221', a first light-shielding region 222', a first light-emitting unit 3, a patterned light-transmitting region 421', and a second light-shielding region 422'.

Figure 7:
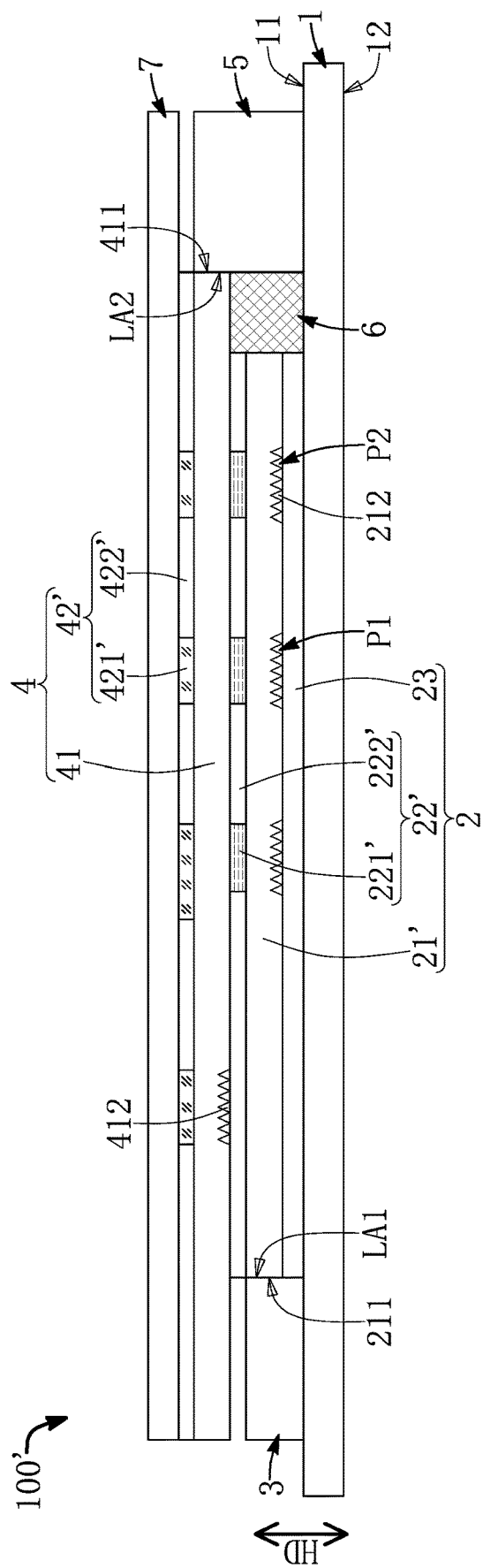
FIG. 7 is a schematic cross-sectional view of the display device according to a second embodiment of the present disclosure.
Figure 8:
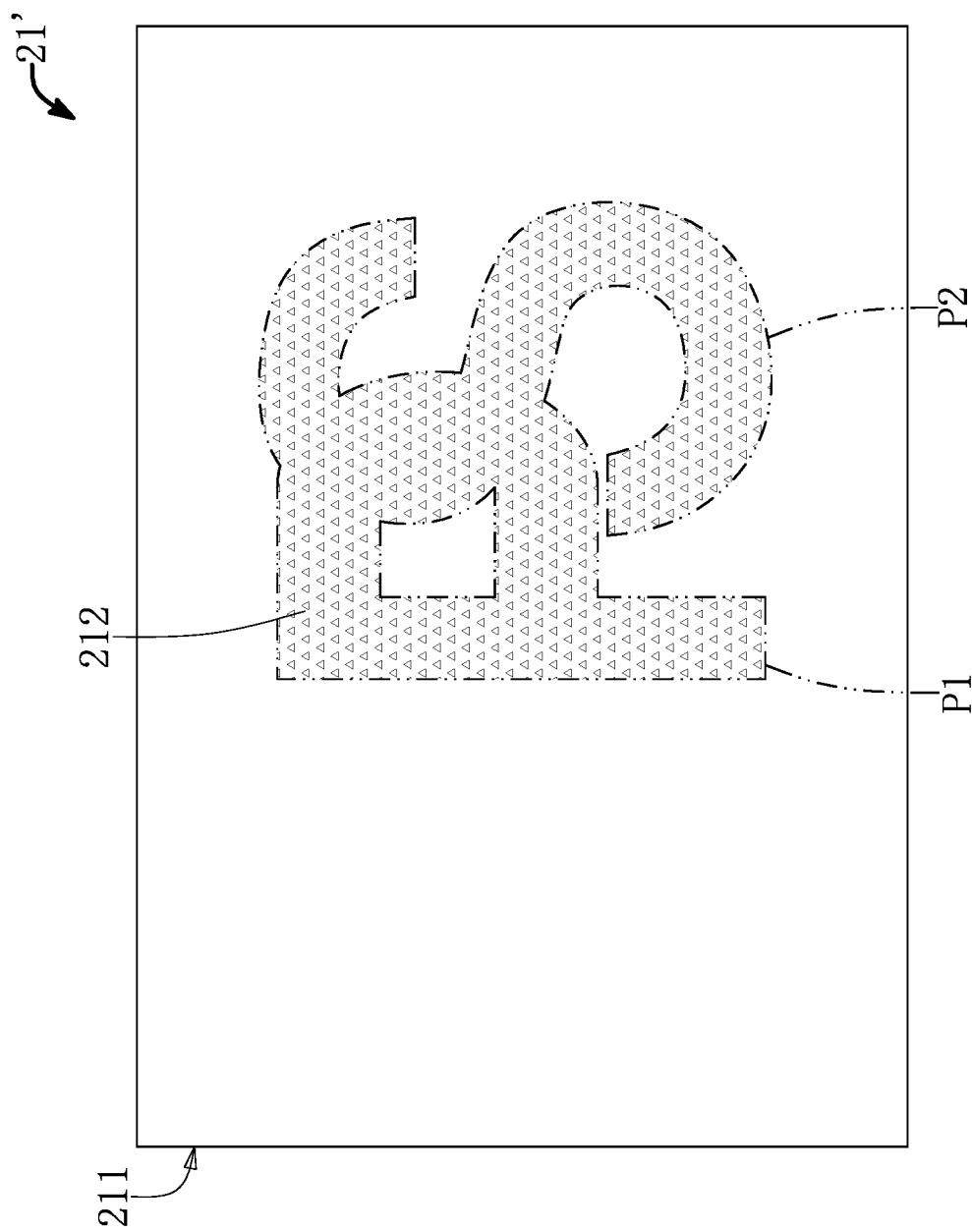
FIG. 8 is a schematic cross-sectional view taken along the first light guide layer of the display device according to the second embodiment of the present disclosure.

As shown in FIG. 7 and FIG. 8, the first light guide layer 21' in the present embodiment includes a first reflective pattern P1 and a second reflective pattern P2. That is, the first microstructures 212 of the first light guide layer 21' are arranged into two specific patterns (e.g., P-shaped and S-shaped).

Figure 9:
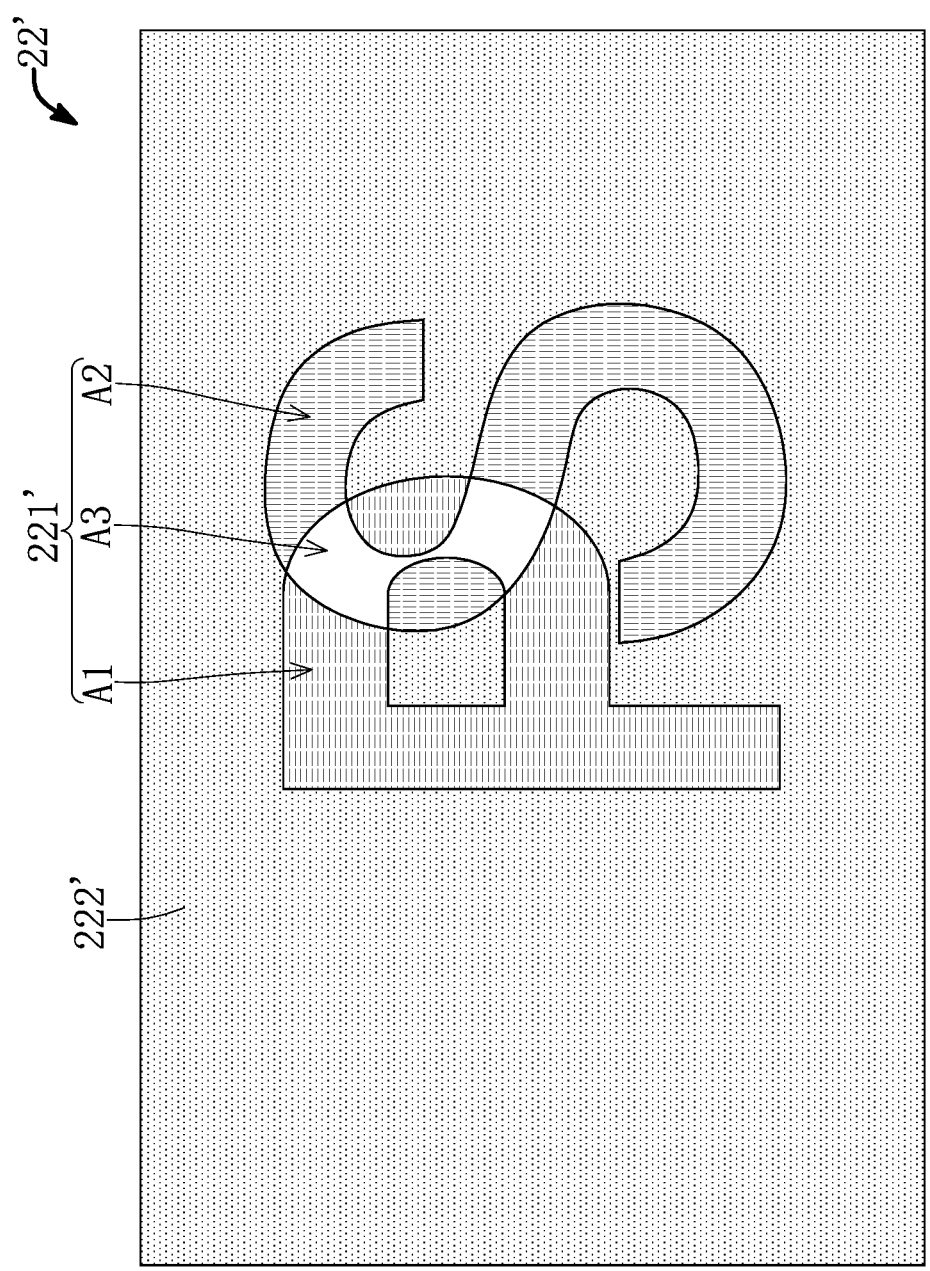
FIG. 9 is a schematic cross-sectional view taken along the first coating layer of the display device according to the second embodiment of the present disclosure.

Referring to FIG. 9, the light permeable colored region 221' in the present embodiment has a first colorant covering region A1 and a second colorant covering region A2 that have different colors (i.e., different penetration spectral ranges). The first colorant covering region A1 corresponds in position to the first reflective pattern P1, and the second colorant covering region A2 corresponds in position to the second reflective pattern P2. In addition, a region defined by orthogonally projecting the first light-shielding region 222' toward the first light guide layer 21' does not overlap with the first reflective pattern P1 and the second reflective pattern P2.

In one practical application, the transparent color material in the light permeable colored region 221' has two different colors. Specifically, the transparent color material has a first color material corresponding to the first reflective pattern P1 (i.e., the first colorant covering region A1) and a second color material corresponding to the second reflective pattern P2 (i.e., the second colorant covering region A2). The first color material and the second color material are light penetrable colors (preferably red and green in color). The first light-shielding region 222' surrounds the light permeable colored region 221'.

Referring to FIG. 8 and FIG. 9, at least one light emitted by the first light-emitting unit 3' in the present embodiment includes a first color light and a second color light that correspond in color to the first color material and the second color material of the light permeable colored region 221'. In other words, a wavelength of the first color light emitted by the first light-emitting unit 3' is within a first transmission spectrum of the first colorant covering region A1, and a wavelength of the second color light emitted by the first light-emitting unit 3' is within a second transmission spectrum of the second colorant covering region A2.

In one practical application, the first light-emitting unit 3' can include a red light-emitting diode (not shown in the drawings) and a green light-emitting diode (not shown in the drawings), the red light-emitting diode can emit the first color light that is red, and the green light-emitting diode can emit the second color light that is green. Accordingly, when the first color light and the second color light emitted by the first light-emitting unit 3' at different times penetrate the first optical unit 2, a viewer can see a red luminous image and a green luminous image from a surface of (the filter cover 7 of) the display device 100 at different times.

Preferably, a range of the first transmission spectrum may not overlap with a range of the second transmission spectrum. Accordingly, the first color light can penetrate the first colorant covering region A1 but cannot penetrate the second colorant covering region A2, and the second color light can penetrate the second colorant covering region A2 but cannot penetrate the first colorant covering region A1. However, the present disclosure is not limited thereto. For example, the first transmission spectrum and the second transmission spectrum can partially overlap according to the design requirements of the first color light and the second color light.

Referring to FIG. 9, the light permeable colored region 221' in the present embodiment further has an overlapping region A3 that corresponds in position to an overlapping position of the first reflective pattern P1 and the second reflective pattern P2. The overlapping region A3 can be penetrated by the first color light and the second color light. In other words, in the present embodiment, a portion of the first colorant covering region A1 overlaps with a portion of the second colorant covering region A2 (i.e., the overlapping region A3), and a transmission spectral range of the overlapping region A3 is within an intersection range of the first colorant covering region A1 and the second colorant covering region A2. For example, when the first colorant covering region A1 is red and the second colorant covering region A2 is green, the transmission spectral range of the overlapping region A3 may be a white or yellow spectral range.

Figure 10:
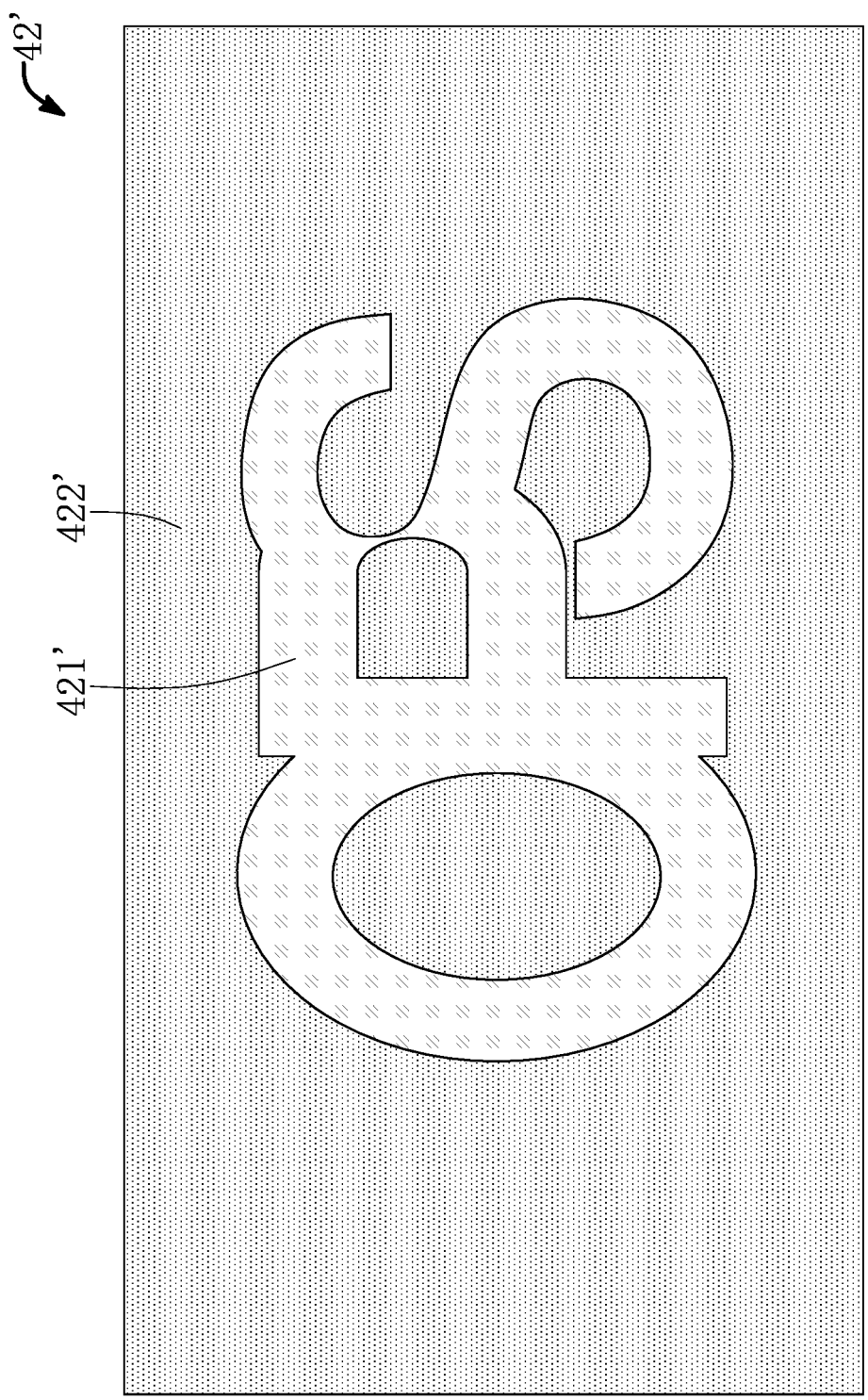
FIG. 10 is a schematic cross-sectional view taken along the second light guide layer of the display device according to the second embodiment of the present disclosure.

Referring to FIG. 10, the patterned light-transmitting region 421' in the present embodiment is located above the first reflective pattern P1, the second reflective pattern P2, and the upper reflective pattern PT of the second light guide layer 41. In addition, the light reflected by the first reflective pattern P1, the second reflective pattern P2, and the upper reflective pattern PT can penetrate the patterned light-transmitting region 421'.

In other words, the patterned light-transmitting region 421' is located on reflection paths of the first reflective pattern P1 and the second reflective pattern P2, and the reflection path of the upper reflective pattern PT. Further, the patterned light-transmitting region 421' has a light-emitting region that corresponds in shape to the first reflective pattern P1, the second reflective pattern P2, and the upper reflective pattern PT. That is to say, an outline of the patterned light-transmitting region 421' corresponds in shape to outlines of the first reflective pattern P1, the second reflective pattern P2, and the upper reflective pattern PT, and a projection path defined by orthogonally projecting the patterned light-transmitting region 421' toward the first light guide layer 21 can pass through the first reflective pattern P1, the second reflective pattern P2, and the upper reflective pattern PT.

Naturally, in order to ensure that light-emitting regions of the first reflective pattern P1 and the second reflective pattern P2 and the light-emitting region of the upper reflective pattern PT can have clearer outlines, the second coating layer 42' in the present embodiment can further include a second light-shielding region 422'. The configuration of the second light-shielding region 422' is substantially the same as that of the second light-shielding region 422 of the first embodiment, and a projection path defined by orthogonally projecting the second light-shielding region 422' toward the first light guide layer 21' does not pass through the first reflective pattern P1, the second reflective pattern P2, and the upper reflective pattern PT.

Accordingly, the light reflected by each of the first reflective pattern P1, the second reflective pattern P2, and the upper reflective pattern PT can penetrate the patterned light-transmitting region 421' to generate luminous images, and the display device 100' in the present embodiment generates three luminous images of different colors (e.g., a blue O-shaped luminous image, a red P-shaped luminous image, and a green S-shaped luminous image).

For ease of understanding, an example of the display device 100' in use is provided below, but the present disclosure is not limited thereto. It should be noted that the first light-emitting unit 3 can emit red light and green light and the second light-emitting unit 5 can emit blue light. However, the red light, the green light, and the blue light are emitted at different time points, respectively. That is, the red light, the green light, and the blue light are not emitted at the same time.

Figure 13:
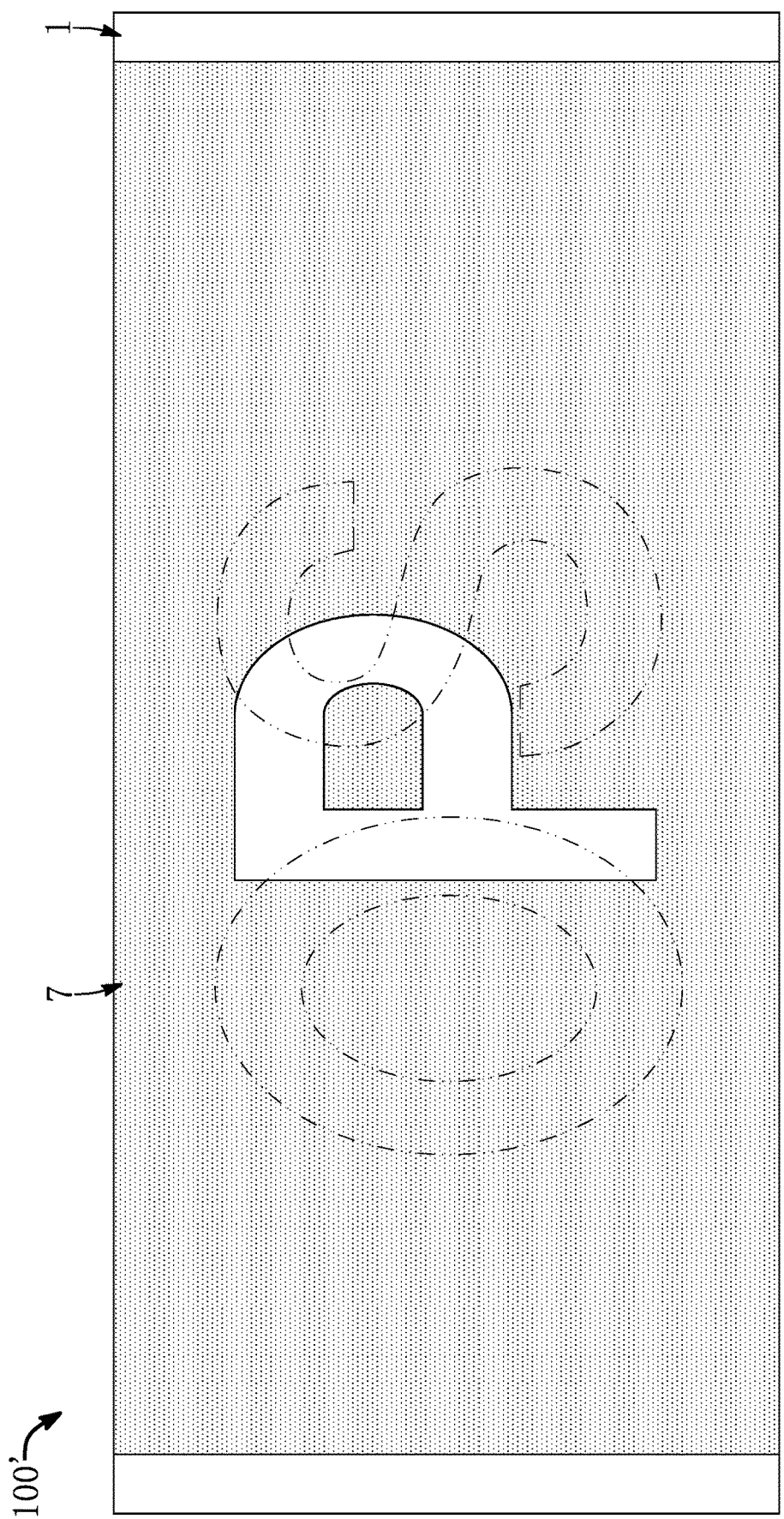
FIG. 13 is a schematic view of the display device displaying a P-shaped pattern according to the third embodiment of the present disclosure.

Specifically, at a first time point, the first light-emitting unit 3 can selectively emit the red light. Referring to FIG. 7, when the first light-emitting unit 3 emits the red light, the red light can pass through the first light guide layer 21' and be reflected by the first microstructures 212 toward the first coating layer 22'. A portion of the red light can pass through the first colorant covering region A1 that corresponds to a red wavelength and the overlapping region A3, and another portion of the red light is blocked by the second colorant covering region A2 that corresponds to a green wavelength (as shown in FIG. 8 and FIG. 9). Accordingly, a red P-shaped luminous image can be formed after the red light passes through the first coating layer 22'. Further, the P-shaped luminous image can pass through the patterned light-transmitting region 421' to be emitted outside the display device 100' (as shown in FIG. 13).

Figure 14:
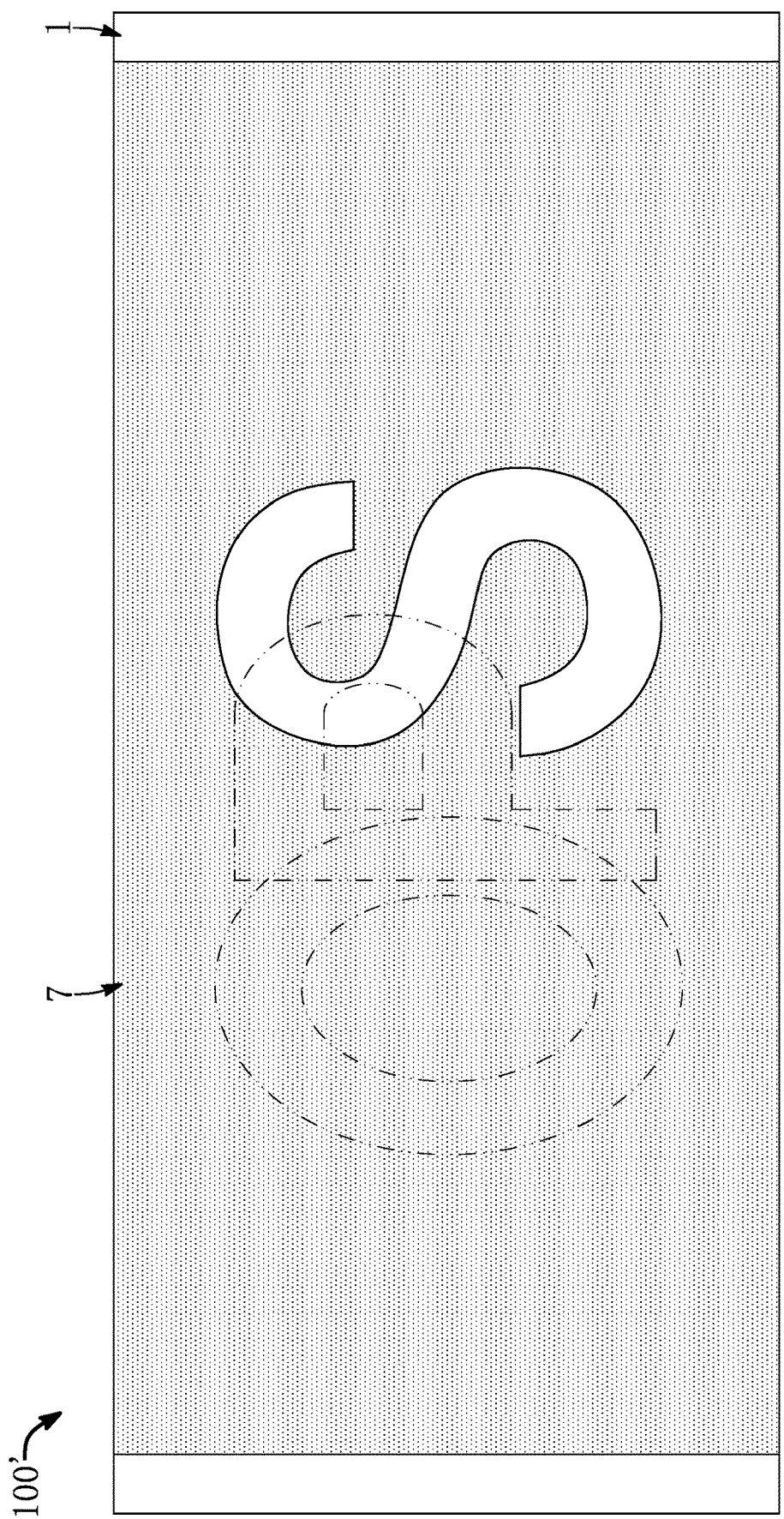
FIG. 14 is a schematic view of the display device displaying an S-shaped pattern according to the third embodiment of the present disclosure.

At a second time point, the first light-emitting unit 3 can selectively emit the green light. Referring to FIG. 7, a path of the green light is roughly the same as that of the red light. A portion of the green light can pass through the second colorant covering region A2 that corresponds to the green wavelength and the overlapping region A3, and another portion of the green light is blocked by the first colorant covering region A1 that corresponds to the red wavelength (as shown in FIG. 8 and FIG. 9). Accordingly, a green S-shaped luminous image can be formed after the green light passes through the first coating layer 22' (as shown in FIG. 14).

Figure 12:
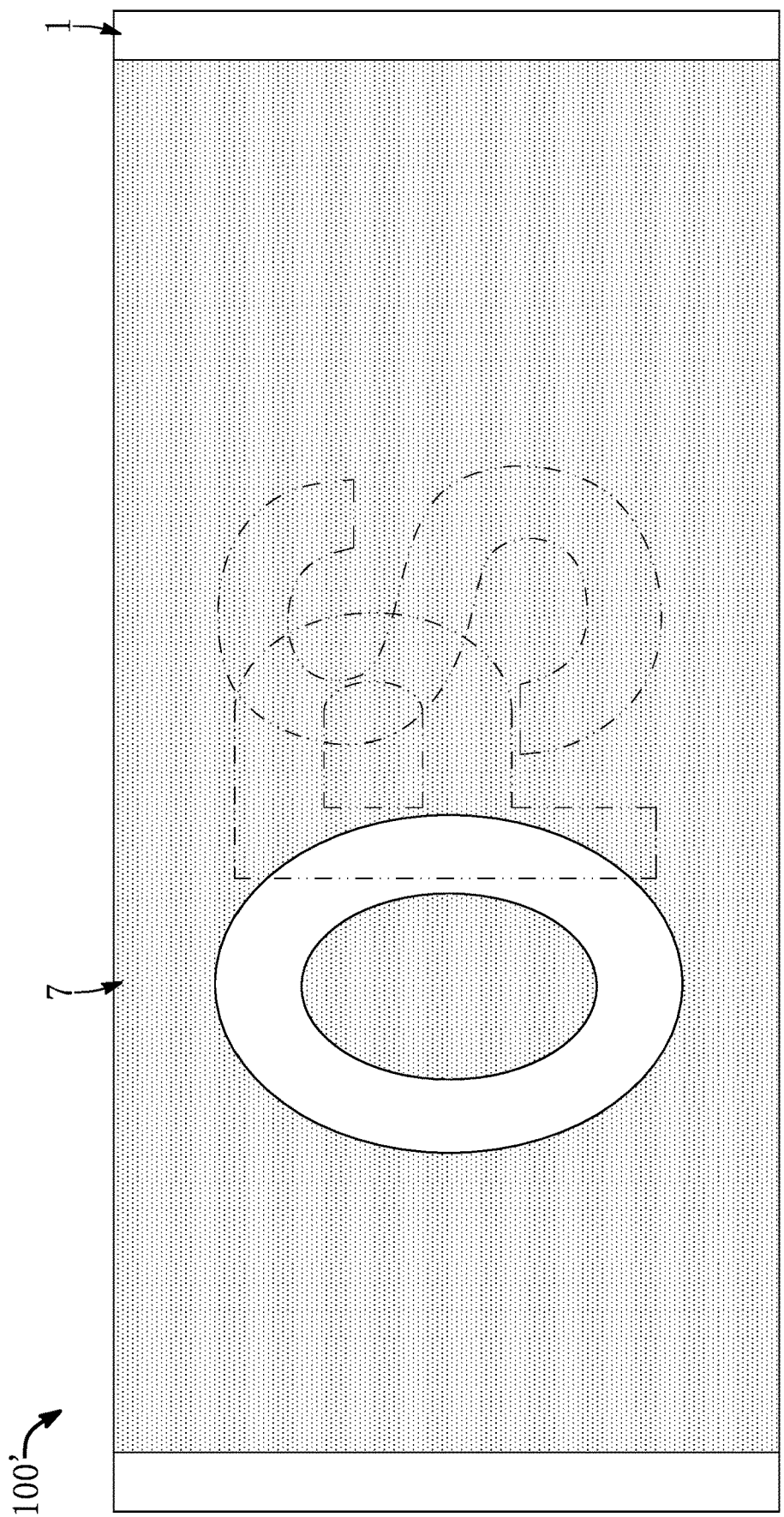
FIG. 12 is a schematic view of the display device displaying a O-shaped pattern according to the third embodiment of the present disclosure.

At a third time point, the second light-emitting unit 5 can selectively emit the blue light. Referring to FIG. 7, when the second light-emitting unit 5 emits the blue light, the blue light can pass through the second light guide layer 41 and be reflected by the second microstructures 412 (that are arranged to have an O shape) toward the second coating layer 42'. Accordingly, a blue O-shaped luminous image can be formed by the blue light, which directly passes through the patterned light-transmitting region 421' to be emitted outside the display device 100' (as shown in FIG. 12).

That is to say, the viewer can see the blue O-shaped luminous image, the red P-shaped luminous image, and the green S-shaped luminous image at the first time point, the second time point, and the third time point, respectively.

Third Embodiment

Figure 11:
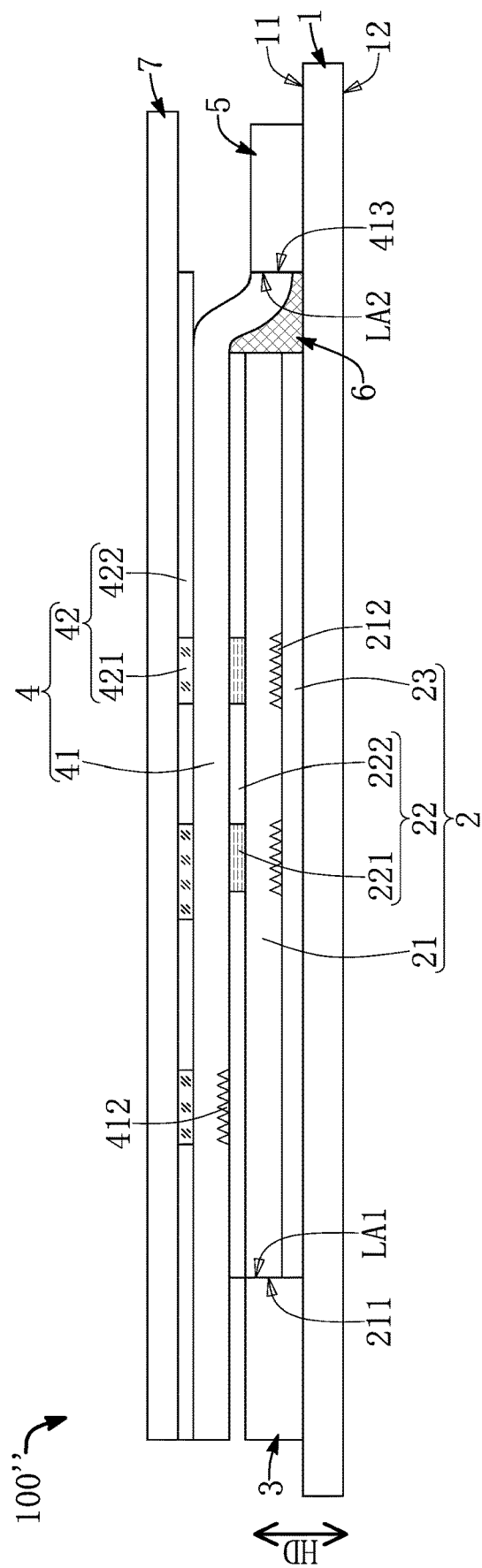
FIG. 11 is a schematic cross-sectional view of the display device according to a third embodiment of the present disclosure.

Referring to FIG. 11, a third embodiment of the present disclosure provides a display device 100". The present embodiment is similar to the first embodiment, and the similarities therebetween will not be repeated herein. The differences between the present embodiment and the first embodiment are mainly as follows.

In the present embodiment, the height of the first light-emitting unit 3 relative to the substrate 1 and the height of the second light-emitting unit 5 relative to the substrate 1 are equal to each other.

Specifically, the second light guide layer 41 in the present embodiment is made of flexible light-transmitting material, and the second light guide layer 41 can be bent in such a way that the second light-emitting region LA2 and the first light-emitting region LA1 are located on opposite sides of the light-blocking unit 6. Moreover, the height position of the second light-emitting region LA2 is approximately equal to the height position of the first light-emitting region LA1. In other words, the second light-emitting region LA2 and the first light-emitting region LA1 are parallel to each other.

Beneficial Effects of the Embodiments

In conclusion, in the display device provided by the present disclosure, by virtue of "the at least one reflective pattern being covered by the light permeable colored region, and the reflective pattern of the second light guide layer and the at least one reflective pattern of the first light guide layer being covered by the patterned light-transmitting region," "the light-blocking unit separating the first light incident surface and the second light incident surface," and "the first light-emitting region corresponding in position to the first light incident surface of the first light guide layer, and the second light-emitting region corresponding in position to the second light incident surface of the second light guide layer," the first light-emitting unit and the second light-emitting unit can each provide light to the corresponding reflective patterns without interfering with each other, so as to further provide different luminous images in the same region.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their exemplary application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A display device, comprising:
   a substrate;
   a first optical unit disposed on the substrate, wherein the first optical unit includes a first coating layer and a first light guide layer, the first light guide layer has at least one reflective pattern, and the first coating layer has a light permeable colored region that covers the at least one reflective pattern;
   a first light-emitting unit disposed on one side of the first optical unit, wherein the first light-emitting unit has a first light-emitting region, and the first light-emitting region corresponds in position to a first light incident surface of the first light guide layer;
   a second optical unit disposed on the first optical unit, wherein the second optical unit includes a second coating layer and a second light guide layer, the second light guide layer has a reflective pattern, and the second coating layer has a patterned light-transmitting region that covers the reflective pattern of the second light guide layer and the at least one reflective pattern of the first light guide layer;
   a second light-emitting unit disposed on one side of the second optical unit, wherein the second light-emitting unit has a second light-emitting region, and the second light-emitting region corresponds in position to a second light incident surface of the second light guide layer; and
   a light-blocking unit separating the first light incident surface and the second light incident surface.

2. The display device according to claim 1, wherein the at least one reflective pattern includes a first reflective pattern and a second reflective pattern, and the light permeable colored region has a first colorant covering region and a second colorant covering region; wherein the first colorant covering region corresponds in position to the first reflective pattern, and the second colorant covering region corresponds in position to the second reflective pattern.

3. The display device according to claim 2, wherein the first light-emitting unit is configured to emit a first color light and a second color light, a wavelength of the first color light is within a first transmission spectrum of the first colorant covering region, and a wavelength of the second color light is within a second transmission spectrum of the second colorant covering region.

4. The display device according to claim 3, wherein the light permeable colored region further has an overlapping region that corresponds in position to an overlapping position of the first reflective pattern and the second reflective pattern; wherein the overlapping region is configured to be penetrable by the first color light and the second color light.

5. The display device according to claim 4, wherein the first color light is red light, the second color light is green light, and light emitted by the second light-emitting unit is blue light.

6. The display device according to claim 1, wherein the first optical unit further includes a reflective layer, and the reflective layer is located on one side of the first light guide layer away from the light permeable colored region.

7. The display device according to claim 6, wherein the reflective layer is black in color.

8. The display device according to claim 1, wherein the first coating layer further has a first light-shielding region, and the second coating layer further has a second light-shielding region.

9. The display device according to claim 1, wherein the second light guide layer is made of a flexible light-transmitting material.

10. The display device according to claim 9, wherein a height of the first light-emitting unit relative to the substrate is equal to a height of the second light-emitting unit relative to the substrate.

11. The display device according to claim 1, further comprising a filter cover disposed on the second optical unit.

12. The display device according to claim 1, wherein the light-blocking unit shields a side surface of the first optical unit facing the second light-emitting unit.

13. The display device according to claim 1, wherein the first light guide layer includes a plurality of first microstructures, and the at least one reflective pattern is formed by the first microstructures; wherein the second light guide layer includes a plurality of second microstructures, and the reflective pattern is formed by the second microstructures.

14. The display device according to claim 13, wherein the light permeable colored region is made of a light-transmitting color material and covers the first microstructures.

* * * * *